United States Patent [19]

Brueck et al.

[11] Patent Number: 4,987,461
[45] Date of Patent: Jan. 22, 1991

[54] HIGH POSITION RESOLUTION SENSOR WITH RECTIFYING CONTACTS

[75] Inventors: Steven R. J. Brueck; Soares, Schubert; Kristin McArdle; Bill W. Mullins, all of Albuquerque, N. Mex.

[73] Assignee: The University of New Mexico, Albuquerque, N. Mex.

[21] Appl. No.: 419,811

[22] Filed: Oct. 11, 1989

[51] Int. Cl.⁵ .......................................... H01L 31/12
[52] U.S. Cl. ...................................... 357/19; 357/30; 357/68; 357/17; 357/74
[58] Field of Search ................ 357/30 C, 30 H, 30 Q, 357/30 P, 30 G, 68, 19, 17, 71, 74

[56] References Cited

FOREIGN PATENT DOCUMENTS

| | | | |
|---|---|---|---|
| 57-78182 | 5/1982 | Japan | 357/30 Q |
| 62-01482 | 9/1986 | Japan | 357/19 |
| 62-49680 | 3/1987 | Japan | 357/19 |
| 62-122284 | 6/1987 | Japan | 357/19 |
| 63-90181 | 4/1988 | Japan | 357/19 |
| 1101672 | 4/1989 | Japan | 357/19 |

OTHER PUBLICATIONS

Wang et al. "The Linearity and Sensitivity of Lateral Effect Position Sensitive Devices-An Improved Geometry", *IEEE Transactions on Electron Devices*, vol. 36, No. 11, Nov. 1989, pp. 2475-2480.

Levine et al., "Lateral Photoeffect in Thin Amorphous Superlattice Films of Si and Ti Grown on a Si Substrate", *Appl. Phys. Lett.*, vol. 49, No. 22, Dec. 1, 1986, pp. 1537-1539.

Willens et al., "High Resolution Photovoltaic Position Sensing with Ti/Si Superlattices", *Appl. Phys. Lett.*, vol. 49, No. 24, Dec. 1986, pp. 1647-1648.

Schmidt et al., "Position-Sensitive Photodetectors Made with Standard Silicon-Planar Technology", *Sensors and Actuators*, 4 (1983) 439-446.

Petersson et al., "Position Sensitive Light Detectors with High Linearity", *IEEE Journal of Solid State Circuits*, vol. SC-13, No. 3, Jun. 1978, pp. 392-399.

Wallmark, "A New Semiconductor Photocell Using Lateral Photoeffect", *Proceedings of the IRE*, Apr. 1956, pp. 474-483.

Niu et al., "Application of Lateral Photovoltaic Effect to the Measurement of the Physical Quantities of P-N Junctions-Sheet Resistivity and Junction Conductance of $N_2^+$ Implanted Si", *Japanese Journal of Applied Physics*, vol 15, No. 4, Apr. 1976, pp. 601-609.

*Primary Examiner*—William Mintel
*Attorney, Agent, or Firm*—Albert Sopp

[57] ABSTRACT

The invention provides a position sensor for detecting relative displacement between two elements, and includes an optical beam-producing source fixed to one of the elements, a semiconductor body fixed to a second element and arranged so that the beams impinge one surface of the semiconductor body, a planar sensor composed of a back-to-back diode photodetector positioned on the semiconductor surface, and readout means to monitor current generated by the sensor which gives a measure of the relative position between the element to which the semiconductor body is affixed.

24 Claims, 4 Drawing Sheets

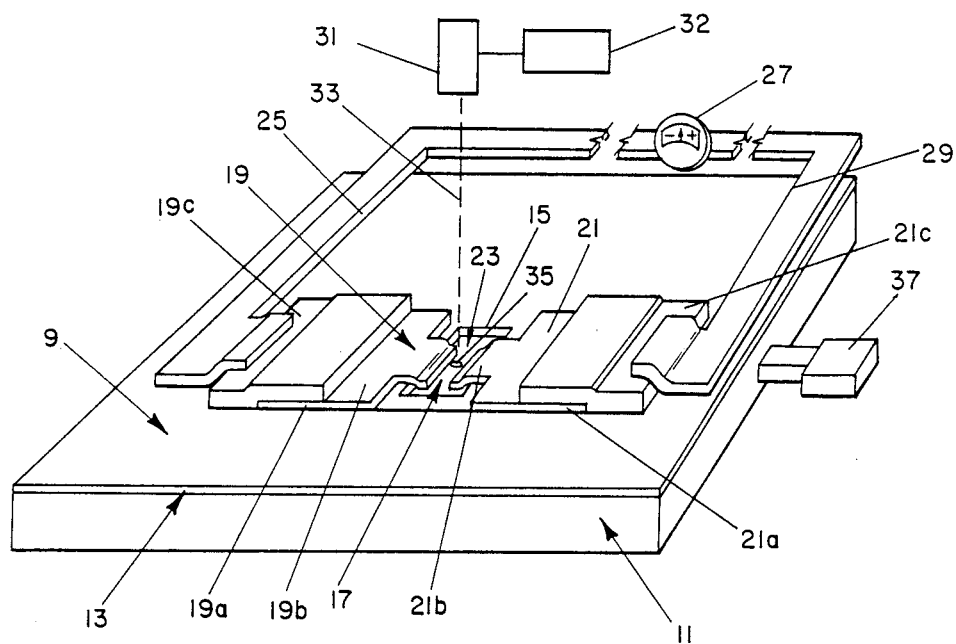
FIG — 1
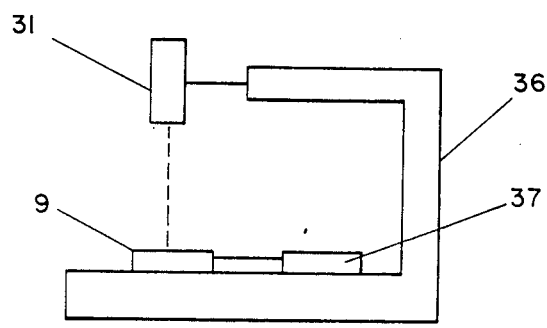
FIG — 1A

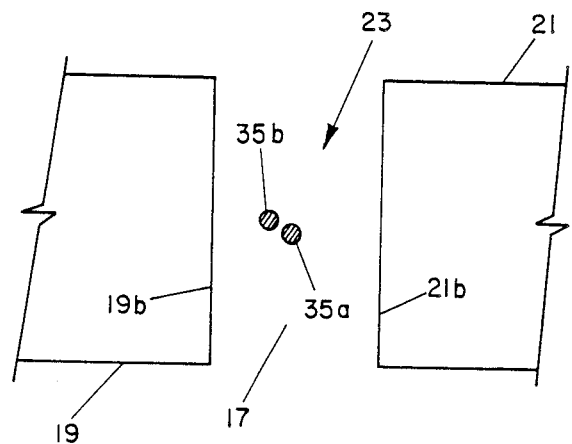
FIG — 2
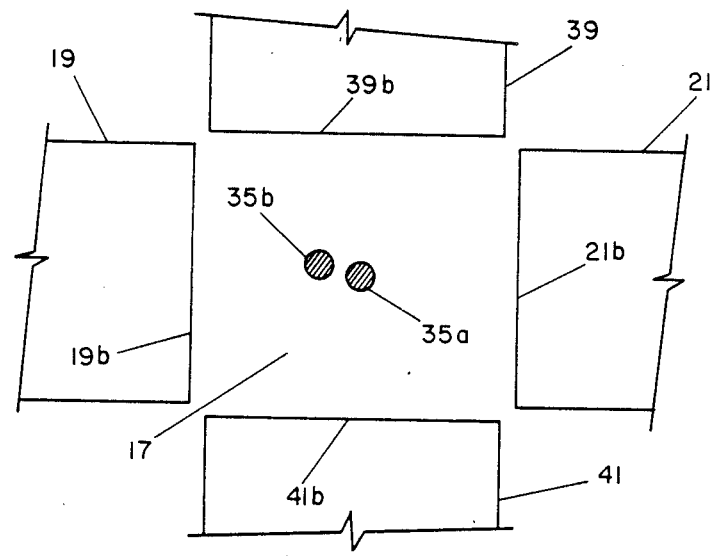
FIG — 3

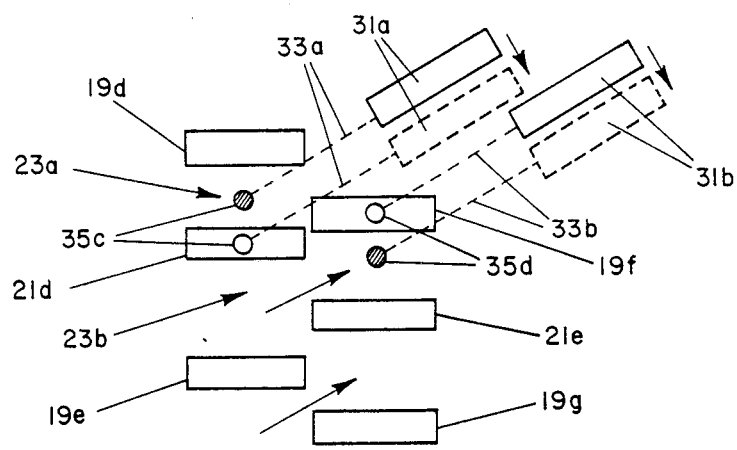
FIG—4
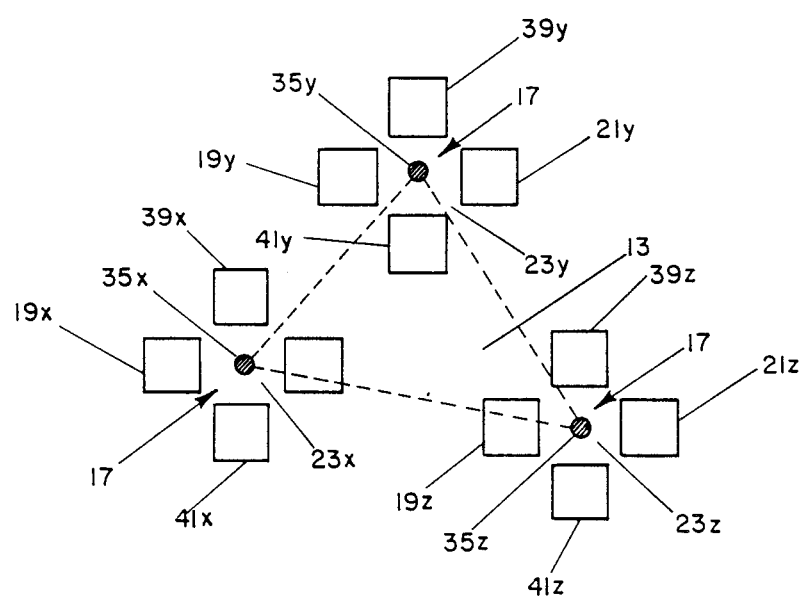
FIG—5

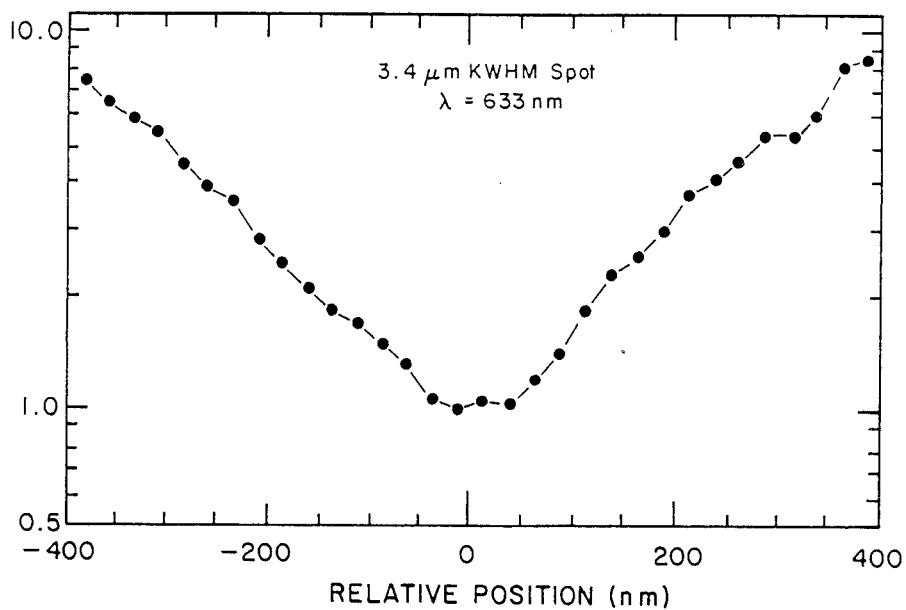
FIG—6
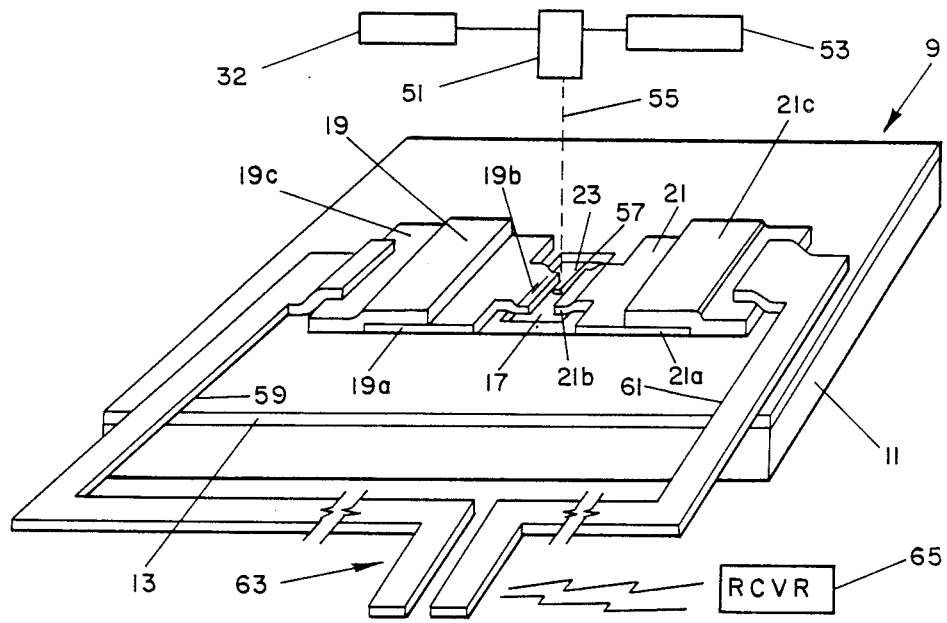
FIG—7

HIGH POSITION RESOLUTION SENSOR WITH RECTIFYING CONTACTS

BACKGROUND OF THE INVENTION

This invention was made in the performance of work under a contract with the Department of the Navy, and the United States Government has certain rights therein.

In the art of microfabrication of modern semiconductor microelectronic devices and systems, extremely accurate sensing of position during the manufacturing process is required to attain the necessary close manufacturing tolerances. Normally, the key device used to obtain the basic measurement information to provide such tolerances is a high resolution position sensor.

Future requirements for tolerances or critical dimensions in microelectronics such as very-large-scale-integrated ("VLSI") circuits are projected to be on the order of 350 nm. Circuit lines and via-holes, etc., will have to be accurate to a fraction of 350 nm to achieve such critical dimensions. A concomitant need is to provide position sensing to enable alignment of multiple levels of lithography used in VLSI manufacture with a similar degree of accuracy. Ideally, this should be done in the exposure tool during or prior to the development of the photoresist level rather than after exposure. The present invention affords this capability.

Another problem is to ensure proper and accurate alignmnent of a laser read/write beam in relation to an optical memory disc where the individual pixels of information on the optical disc memory have dimensions of the order of an optical wavelength.

Accurate alignment is also critically important in a number of different architectures relating to multiplanar optical processor chips where, say, optical signals generated in one plane are optically modulated in a second plane and detected in a third plane of the processor. Alignment problems also exist from chip-to-chip in conventional microelectronic arrangements.

In general, as manufacturing tolerances and dimensions become smaller, the need for accurate alignment through use of advanced position sensing means such as is afforded by the present invention are increasingly critical.

FIELD OF THE INVENTION

This invention generally lies within the field of photelectric detection and position sensing and more particularly in the field of semiconductor position sensing employing sharply focused laser beams.

DESCRIPTION OF RELATED ART

Currently, the operational motif for many commercial semiconductor position sensors is to generate a lateral photovoltage along a large p-n junction. This requires a large area and provides resolution or position measuring sensitivities only to about 10 micrometers. Furthermore, currently available devices require use of both the front and back of the semiconductor device, thereby severely reducing the compatability of the device when it is desired to incorporate it in existing or multiplanar integrated circuit structures. In other words, there is not currently available a position sensor device having its semiconductor surface and electrode connections in a purely planar configuration thereby enabling easy incorporation of the position sensor into multiplanar integrated circuits. Also, the sensitivity, i.e., resolution capability of presently available sensors is limited.

Specific prior art arrangements of interest include the Hewlett-Packard "Laser Position Transducer System" Model 5527A which, as stated in its brochure, provides sensing accuracy to plus or minus 0.1 parts per million and a maximum resolution of 10 nm (0.4 μin). Another includes the bi-cell and quadrant cells units manufactured by United Detector Corporation (UDT) of Hawthorne, Calif., which employs arrays of photo diodes to provide resolution down to only 0.0005 inches. The phenomenon of lateral photoeffect in semiconductor photocells has been known since about 1956 and has been discussed beginning with the article entitled "A New Semiconductor Photocell Using Lateral Photoeffect" by J. T. Wallmark, Proc. IRE, April, 1956, pp 474–483 and further in "Application of Lateral Photovoltaic Effect to the Measurement of Physical Quantities of P-N Junctions—Sheet Resistivity and Junction Conductance of $N_2^+$ Implanted Si" by Niu et al in Japanese Journal of Applied Physics, Vol. 15, No. 4, April, 1976, and more recently, "Position Sensitive Light Detectors with High Linearity" by G. P. Peterson and L. Lindholm, IEEE Journal of Solid-State Circuits, Vol. SC-13, No. 3, June, 1978, pp 392-399, "Position-Sensitive Photodetectors Made with Standard Silicon-Planar Technology" B. Schmidt and R. Ross, Sensors and Actuators 4 (1983) 439–446, "Lateral photoeffect in thin amorphous superlattice films of Si and Ti grown on a Si substrate" by Levine et al, Appl. Phys. Lett., Vol. 49, No. 22, 1 Dec., 1986, pp 1537–1539, and "High resolution photovoltaic position sensing with Ti/Si superlattices" by Willens et al, Appl. Phys. Lett., Vol. 49, No. 24, 15 Dec. 1986, pp 1647,8, all of which require use of electrode connections to both surfaces (i.e., on opposite sides of the surface) of the semiconductor material of the detector.

SUMMARY OF THE INVENTION

The present invention provides a planar semiconductor position sensor or detector having resolution capability below 100 nm and its position readout means such as electrode contacts coupled to or located on one detector surface rather than two such surfaces.

In one form the invention provides a position sensor for detecting relative displacement between two elements, and includes an optical beam-producing source fixed to one of the elements, a semiconductor body fixed to a second element and arranged so that the beams impinges one surface of the semiconductor body, a planar sensor composed of a back-to-back diode photodetector positioned on the semiconductor surface, and readout means to monitor current generated by the sensor which gives a measure of the relative position between the element to which the beam source is affixed and the element to which the semiconductor body is affixed.

More particularly, in accordance with one embodiment of the invention, there is provided an optical source such as an He-Ne laser at 633 nm fixed to one element such as an optical table. The beam is transformed via any suitable optical system to the plane of a surface of a semiconductor substrate. The semiconductor material may be silicon. At the plane of the substrate the beam terminates in a 3.4 μm FWHM Gaussian spot. The semiconductor substrate is mounted on or otherwise suitably connected to a piezoelectric driver or translator which in turn is also mounted on the optical table. The sensor comprises two or more rectifying contacts or electrodes positioned on the surface of the semiconductor and spaced apart from each other by about 4.5 μm. The substrate is photosensitive at the wavelength of the optical source and when irradiated produces a short circuit current. The rectifying contacts may be formed of evaporated nickel (Ni) films forming Schottky barrier contacts to the Si. The contacts are connected to readout means via a metallized portion of chromium-gold (Cr:Au) and 25-mil gold wires. The readout means may be a low impedance picoammeter which monitors the short circuit current. An arrangement in accordance with this embodiment may typically produce relative position sensitivity of a beam movement (relative movement between the two elements of less than plus or minus about 37 nm. Of course, environmental conditions caused by vibrations, air currents, etc., may affect the degree of resolution.

BRIEF DESCRIPTION OF THE DRAWINGS

Reference is now made to the drawings in which like numerals represent like parts and in which:

FIG. 1 is a view of a position sensing semiconductor device in accordance with an embodiment of the invention;

FIG. 1A is a view in schematic form of an arrangement in accordance with an embodiment of the invention for sensing the relative movement between two elements;

FIG. 2 is a diagrammatic view of a top portion of the device of FIG. 1;

FIGS. 3, 4, and 5 are diagrammatic views of portions of position sensing devices in accordance with other embodiments of the invention;

FIG. 6 is a graph of beam position versus current which indicates the position sensitivity of a position sensing device in accordance with an embodiment of the invention; and FIG. 7 is a view of a position sensing semiconductor device in accordance with another embodiment of the invention.

DESCRIPTION OF THE PREFERRED EMBODIMENTS

Referring to the embodiment shown of the invention shown in FIGS. 1, 1A, and 2, there is shown a sensor 9 having a semiconductor body or substrate 11 of any suitable material such as silicon (Si) on which there is layered a thin dielectric film 13 of thermally grown silicon dioxide ($SiO_2$) or any other suitable material. The film 13 is preferably about 80 nm thick. A rectangular window 15 of area about 100 to 500 $\mu m^2$ is provided in the surface of the thin film 13 to expose a planar portion 17 of the semiconductor body 11 having about the same dimensions as the window 15.

The detector elements of the sensing device of this embodiment comprise a pair of metallic film contacts 19 and 21 having respective back portions 19a and 21a located on the thin film 13 on opposite sides of the window 15. The thin film 13 insulates or isolates the back portions 19a and 21a from the semiconductor body 11. The metal used for the contacts 19 and 21 may be nickel (Ni) or any other suitable well known metal.

The metallic film contacts 19 and 21 have respective rectangular front portions 19b and 21b formed or deposited in any suitable well known manner to fit over the edge of the thin film 13 at opposite sides of window 15 so that portions 19b and 21b are in intimate physical contact with the surface of planar portion 17 of the semiconductor 11 and so that the extremities of the portions 19b and 21b are spaced apart from each other by a gap of about 4.5 μm. Thus, the planar portion 17 of the body 11 has an exposed area or gap 23 about 4.5 μm wide between the extremities of the contact portions 19b and 21b. The front portions 19b and 21b constitute Schottky barrier contacts and thus, along with the planar portion 17, define the active detector or photo diode area of the sensor 9.

The dielectric thin film 13 is sufficiently thick so that junction capacitance and dark current are reduced and so that the semiconductor body is protected from diffusion of bonding metals. That is, the diffusion into the crystal and the subsequent alloying that occurs between Au, used in bonding the oxide film or contact layer 13 and the Si substrate, is also prevented.

As stated earlier, in accordance with one embodiment of the invention, the elements 19 and 21 are composed of a Ni film which, by way of illustration, may have a resistance of about 50-60 ohms across the detector and which may have a transmission of about 17% at 334.5 nm. As mentioned previously, the respective portions 19b and 21b of the metallic elements in contact with the planar surface 17 of the semiconductor substrate 11 comprise a metal-semiconductor-metal (MSM) photodiode.

Of particular advantage in accordance with this invention is the arrangement of the bonding contacts on the same side or surface of the sensor 9, e.g., the upper side as shown in FIG. 1. Specifically, there are provided for the respective elements 19 and 21 generally rectangular bonding contacts 19c and 21c each composed of a 30 nm thick layer of chromium (Cr) over which is bonded a 170 nm thick layer of gold (Au). Viewed sideways, the bonding contacts 19c and 21c are formed or deposited to fit over the respective ends of back portions 19a and 21a of the metallic film contacts or electrodes 19 and 21.

For readout purposes a lead 25 is electrically connected to one side of a low impedance device such as a picoammeter 27 (which, as indicated by the break off line, may be remotely located) and to the bonding contact 19c, and a lead 29 is similarly connected to the other side of ammeter 27 and to the bonding contact 21c. All of these connections may be made in any suitable well known manner.

In providing position sensing in accordance with the invention, there is provided a source 31 which may include optical transmission devices of any suitable well known design to provide a sharply focused narrow beam of light or other radiation such as a laser beam 33 with a Gaussian beam waist or similar measure of focal spot 35 reaching planar surface 17. At the point of focus the size of the beam spot 35 on the planar surface should be at least smaller than the distance or gap 23 between the extremities of front portions 19b and 21b of contacts or electrodes 19 and 21. i.e., the inter-electrode gap.

For example, as indicated in FIG. 1A the source 31 may include a single mode optical fiber located just above the planar surface 17 and attached to a first member or element 36 which may be an optical table. Also as shown in FIG. 1A, the sensor 9 is located on the optical table 36 for movement by a second element 37 such as a piezoelectric driver mounted on said table. The phenomenon to be measured or sensed is the relative movement between the elements 36 and 37. Consequently, in accordance with the invention there is provided a planar semiconductor position sensor or detector having two spaced apart contacts, electrode portions 19b and 21b, on the beam-illuminated planar surface 17 of the sensor 9. The two electrode portions 19b and 21b are in opposing or symmetrical relationship as shown in FIG. 1. Consequently, there will be a short circuit photocurrent arising from the illumination of the planar surface 17 by the beam 33. When the beam spot 35 is symmetrically located with respect to the electrodes, e.g., equidistant from each on planar surface 17 as indicated by the numeral 35a in FIG. 2, the short circuit photocurrent will exhibit a null. That is, as seen by the ammeter 27, the current flow will be minimal or may be calibrated to a normalized value of zero.

For example, referring to the graph of FIG. 6, with a beam spot size of about 3.4 nm FWHM, a laser beam wavelength of about 633 nm, and an inter electrode gap of about 4.5 $\mu$m, there will be a null in the short circuit photocurrent $I_{sc}$ when the beam spot is symmetric to or equidistant between the electrodes. The width of this null on the planar surface 17 is about 75 nm. As the beam is displaced outward from the null position 35a of the beam spot to a different position indicated in FIG. 2 as 35b, there is a 4 nA per 25 nm variation in $I_{sc}$ across the range of the planar surface 17, said current crossing a minimal level at the central or null position. If the beam spot moves to the right, i.e., toward the electrode 21, the photocurrent amplitude will increase at electrode 19 causing the current flow to be in a direction opposite to that which will occur if the beam were displaced closer to the electrode 19 than 21. Thus, the ammeter 27 will indicate the direction of displacement of the beam spot 33.

Also, it will be appreciated that as indicated by the graph of FIG. 4, resolution of the displacement of the beam 33 in terms of change in $I_{sc}$ occurs at increments of about 25 nm of beam spot displacement.

Referring now to FIG. 3, according to the embodiment shown therein two dimensional position sensing is provided. As shown in FIG. 3, two additional spaced apart electrodes or contacts 39 and 41 constructed and arranged as part of the sensor 9 in exactly the same manner as described for the contacts 19 and 21 have front electrode portions 39b and 41b with their undersides providing Schottky contacts with the planar surface 17 of the semiconductor body 11 and with their edges terminating at right angles to the edges of portions 19b and 21b of electrodes 19 and 21.

In exactly the same manner as described in FIG. 1 connection with the contacts 19 and 21, the contacts 39 and 41 may be connected to a suitable readout device such as a low impedance ammeter (not shown) similar to the ammeter 27. Consequently, as shown in the Figure, when the beam spot is displaced from its central or null location 35a to a skewed location at 35b, there will be provided at the readout device for the contacts 19 and 21 a first short circuit photocurrent corresponding to left-right displacement of the beam spot and at the readout device for the contacts 39 and 41 a second short circuit photocurrent corresponding to the up-down displacement of the spot. Obviously, the radial displacement of a beam spot from a central null may be provided in any suitable well known manner by combining vectorially the outputs of the two readout devices.

Reference is now made to FIGS. 4 and 5. As indicated in the embodiment of FIG. 4, there may be provided an array of any suitable number of staggered gaps formed by staggering the positions of the contacts. This arrangement permits measurement of beam displacement over a greater range than with one gap. Thus, by way of illustration there is shown in FIG. 4 a first array of gaps 23a and 23b are formed by contacts 19d, 21d, and 19e, and a second array of gaps 23c and 23d adjacent to and staggered from gaps 23a and 23b on the semiconductor substrate. The gaps 23c and 23d are formed by contacts 19f, 21e, and 19g. A pair of radiation sources 31a and 31b such as two separate laser sources which produce respective laser beams 33a and 33b are attached to a first element or member (not shown) whose movement is to be measured. Alternatively, one source of a laser or other optical beam may be provided and which is focused and split by means of any suitable well known optical transmission means into two, spaced apart beams. Thus, sources 31a and 31b or one source with split beam-producing means produce two respective laterally spaced beams 33a and 33b which terminate at spaced apart spots 35c and 35d on the array. When beam spot 35c is midway in gap 23a, the beam spot 35d is on contact 19f. As indicated by the broken lines which show displacement of the beams due to relative movement between the beams and semiconductor, when beam spot 35c is on contact 21d, beam spot 35d is midway in the gap 23c. In reading out the displacement information relating to the displacement of the element to which the beam sources are attached, the output of the readout device may be stored and added in any suitable well known manner to provide a summed readout corresponding to the total displacement of the element as the beams spots alternately transit from gap to gap. Other arrangements for processing such readouts will be apparent to those skilled in the art.

In FIG. 5, the contacts or electrodes are arranged in groups of four (see FIG. 3) to form a pattern of gaps 23x, 23y, and 23z thereon, thereby providing pattern recognition capability for the invention. Of course, as many groups as desired may be employed. As shown by way of illustration in FIG. 5, there is a first group comprising four electrodes or contacts 19x, 39x, 21x, and 41x, a second group with four contacts 19y, 39y, 21y, and 41y, and a third group with electrodes 19z, 39z, 21z, and 41z, each of said groups being arranged on a semiconductor surface in the precise manner as described in connection with FIG. 3. Thus, there are provided respective interelectrode gaps 23x, 23y, and 23z on the surface 17 of the semiconductor substrate. Respective beams spots 35x, 35y, and 35z are shown in the gaps 23x, 23y, and 23z. The beams for each repetive beam spot has its source fixed to one of three respective elements (not shown). When the elements are positioned in correct predetermined positions such that each of the respective beam spots 35x, 35y, and 35z are centered in respective gaps 23x, 23y, and 23z, the individual and collective read out based on the short circuit current in each of the sensors defined by the electrode groups will be at its minimum value, thereby indicating that the elements are in the desired pattern.

It will occur to those skilled in the art that other numbers, configurations, and arrays of electrodes may be provided depending upon the number, extent and nature of the incident beam displacements to be sensed.

Turning now to the embodiment shown in FIG. 7, instead of employing electrically connected readout means for the sensor 9, a radio frequency arrangement may be employed to provide remote readout. Specifically, a laser beam or other source of focused radiation 51 having a fixed relation to the movable member or element 32 is driven by radio frequency carrier waves of any suitable frequency from an RF source 53 to produce a sinusoidal or other varying light beam 55 to a spot 57 on the planar surface 17 of gap 23 on planar surface 17. The contacts 19 and 21 of the sensor 9 are connected via respective leads 59 and 61 to an antenna 63 which may be situated in any suitable well known manner on the thin oxide film 13 or elsewhere, as indicated, so that the antenna and leads are insulated from the semiconductor body 11. In actuality, of course, the size of the antenna 63 would be much larger than as shown. There is also provided a receiver 65 constructed in any suitable well known manner to receive and analyze the phase and amplitude of waves transmitted by the antenna 63. Alternatively, instead of employing an antenna, the receiver 65 may be a radio frequency current meter connected to the leads 59 and 61. In all other respects as indicated by the same reference numerals, the nature and arrangement of the elements in the embodiment shown in FIG. 7 are identical to those of FIG. 1.

When the RF-modulated light beam 55 impinges at the central or null point of the planar surface 17 in gap 23, RF modulated waves of short circuit photocurrent of opposite phase and of equal amplitude are detected by the electrodes or contacts 19 and 21 and fed to the antenna 63 which will thus transmit zero or near zero level waves to the receiver. When the spot 57 is displaced due to movement of the beam 55, say, to the right and thus closer to the electrode 21 and farther from the electrode 19, the short circuit photocurrent at the left hand electrode 19 will have greater amplitude than that of the right hand electrode 21. The phase relationship of the waves reaching the respective electrodes 19 and 21 will also be different, thus causing transmission from the antenna 63 of waves varying in both phase and amplitude depending on the extent of displacement of the spot 57 from its null position.

Preferably, the frequency of the RF should be selected so that identical phase conditions are not repeated for different excursions of the spot 57, thus simplifying the phase discrimination requirements. Of course, other modulation schemes well known in the art may be employed so long as the receiver/analyzer is appropriately calibrated to correctly interpret the detected modulation in any suitable well known manner. For example, another scheme is to modulate or vary the current produced by the laser beams source where that source is a semiconductor diode laser. Another is to impose a continuous wave (cw) on the output of an unmodulated laser source. Yet another arrangement is to use the beat frequency or interference between two laser beams of slightly different frequency as the varying or modulating frequency.

It is understood that variations and modifications of the invention and its embodiments will occur to those skilled in the art, and that the scope of the invention is limited only by the following appended claims.

What is claimed is:

1. A semiconductor position sensor capable of detecting changes of position in the movement of a member comprising:
   a. radiation beam-producing source means coupled to the member to move in correspondence therewith;
   b. means including a semiconductor body, said body having one surface exposed to said beam, said beam thereby terminating in an irradiated spot on said surface;
   c. a plurality of contact means each having a portion contacting said one surface at a location spaced apart from the location of the other portions of said means to provide rectifying contact barriers with a gap therebetween, there being a short circuit photocurrent at a level when the spot is at a predetermined null position in said gap, the photocurrent being at other, different levels when the spot occupies other, different positions in said gap, and
   d. readout means coupled to said plurality of contact means to provide an indication of the extent of displacement of the member when, due to movement of the member and thus the beam, the spot is displaced from its previous position.

2. The sensor of claim 1 wherein said plurality of contact means is greater than 2.

3. The sensor of claim 1 wherein said means further includes:
   a. a dielectric film on said one surface of said semiconductor body and having a window coextensive with said gap.

4. The sensor of claim 3 wherein said source means comprises a laser.

5. The sensor of claim 4 wherein said source means comprises a semiconductor laser.

6. The sensor of claim 4 wherein the frequency of said source is above the bandgap of the semiconductor body.

7. The sensor of claim 1 wherein the diameter of said spot is less than the gap.

8. The sensor of claim 1 wherein said readout means comprises:
   a. electrically conductive means connected to each of said contact means, and
   b. electrical signal responsive means connected to said electrically conductive means to provide an indication of change in said photocurrent responsive to movement of the spot.

9. The sensor of claim 1 wherein said radiation beam-producing source means includes means for varying a characteristic of said beam source means and wherein said readout means comprises:
   a. antenna means;
   b. means electrically connecting each of said contact means to said antenna means whereby the antenna radiates signals produced by said contact means, and
   c. receiver means for receiving signals from said antenna means, said signals representing the extent of modulation of the varying characteristic of said beam due to changes in said photocurrent responsive to movement of said spot.

10. The apparatus of claim 8 wherein said antenna means comprises a metallic element positioned on said dielectric film.

11. A sensor for detecting relative displacement between first and second elements comprising:
   a. optical source means having a fixed relationship to the first element;
   b. a semiconductor body having a fixed relationship with the second element;
   c. optical transmission means for propagating optical emission from said optical source to a surface of said semiconductor body thereby producing an irradiated area on said semiconductor surface;

d. spaced apart rectifying contact means located on said surface of said semiconductor adjacent said exposed area, and e. readout means for monitoring the short circuit photocurrent flowing between said rectifying means due to the effect of the irradiated area on said surface, the amplitude of said photocurrent being a function of the position of the irradiated area with respect to the rectifying contact means.

12. The sensor of claim 11 wherein said rectifying contact means comprises a plurality of pairs of rectifying contacts disposed on said surface to provide a plurality of respective photocurrents representing the position of said irradiated area with respect to corresponding pairs of contacts.

13. The sensor of claim 11 wherein said optical transmission means includes means to produce a geometrical pattern of the irradiated area and wherein said contact means comprises a multiplicity of contacts arranged to match said pattern, thereby providing pattern recognition.

14. The sensor of claim 11 wherein said contact means comprises two groups each having at least three spaced apart contacts such that the locations of the resulting gaps between contacts in one group are juxtaposed with locations of the contacts in the other group, and said source means includes means for producing two spaced apart beams positioned such that when one beam impinges on a contact of one group, the other beam impinges on said surface of the semiconductor body in a gap between contacts in the other group, and vice versa.

15. The sensor of claim 11 wherein said source means comprises a lamp with at least a portion of the radiation emitted by said lamp having wavelengths corresponding to energies above the bandgap of said semiconductor body.

16. The sensor of claim 11 wherein said source means comprises a laser with an emission wavelength above the bandgap of said semiconductor body.

17. The sensor of claim 11 wherein said contact means comprises a patterned, deposited metal film forming isolated Schottky barrier rectifying contacts.

18. The sensor of claim 11 wherein said contact means further comprises:

a. a dielectric film on said semiconductor surface;

b. an area of said film removed to expose the surface of said semiconductor body, and c. a film of metal deposited to overlap said dielectric film and a portion of the exposed surface of said semiconductor body thereby forming isolated Schottky barrier rectifying contacts with said exposed surface.

19. The sensor of claim 18 wherein the semiconductor body is comprised of silicon, the dielectric film is silicon dioxide, the contact metal film is nickel, the gap between said contacts is approximately 4.5 μm, and the irradiated area is approximately 3.4 full width at half maximum.

20. The sensor of claim 1 wherein said readout means comprises:

a. electrically conductive means connected to each of said contact means, and b. current meter means responsive to the short circuit photocurrent flowing between contact means resulting from irradiation of said surface, the amplitude of said photocurrent being a function of the position of the irradiated area with respect to said contact means.

21. The sensor of claim 11 wherein said optical source includes means for producing modulation of said beam at a frequency, and said readout means comprises:

a. electrically conductive means connected between contact means for carrying current at the modulation frequency, and b. current meter means responsive to the component of the photocurrent modulated at said frequency flowing between said contact means, said component of the photocurrent being a function of the position of the irradiated area relative to said contact means.

22. The sensor of claim 11 wherein said optical source means includes means for modulation of said beam at a frequency, and said readout means comprises:

a. electrically conductive means connecting said contact means for carrying a component of the photocurrent at said modulation frequency, b. antenna means coupled to said electrically conductive means, and c. receiver means responsive to the component of the energy radiated by said antenna means modulated at said frequency, said component received by the receiver corresponding to the component of the photocurrent which is a function of the position of said irradiated area in relation to said contact means.

23. The sensor of claim 21 wherein said frequency is a radio frequency.

24. The sensor of claim 22 wherein said frequency is a radio frequency.

* * * * *